United States Patent
Ishiguro et al.

(10) Patent No.: US 9,699,909 B2
(45) Date of Patent: Jul. 4, 2017

(54) WIRING BOARD WITH BUILT-IN ELECTRONIC COMPONENT

(71) Applicant: IBIDEN CO., LTD., Ogaki-shi (JP)

(72) Inventors: Naohito Ishiguro, Ogaki (JP); Yasushi Inagaki, Ogaki (JP)

(73) Assignee: IBIDEN CO., LTD., Ogaki-shi (JP)

( * ) Notice: Subject to any disclaimer, the term of this patent is extended or adjusted under 35 U.S.C. 154(b) by 234 days.

(21) Appl. No.: 14/455,012

(22) Filed: Aug. 8, 2014

(65) Prior Publication Data
US 2015/0043183 A1    Feb. 12, 2015

(30) Foreign Application Priority Data

Aug. 9, 2013    (JP) .................................. 2013-165662

(51) Int. Cl.
| | | |
|---|---|---|
| H05K 1/18 | (2006.01) | |
| H05K 7/00 | (2006.01) | |
| H05K 3/46 | (2006.01) | |

(52) U.S. Cl.
CPC ........... *H05K 1/185* (2013.01); *H05K 3/4602* (2013.01); *H05K 3/4644* (2013.01); *H05K 2201/10* (2013.01); *H05K 2201/10015* (2013.01); *H05K 2201/10507* (2013.01); *H05K 2203/0156* (2013.01)

(58) Field of Classification Search
CPC .......................... H05K 1/185; H05K 2201/10
USPC ........ 174/255, 260, 262; 361/760, 761, 763, 361/764
See application file for complete search history.

(56) References Cited

U.S. PATENT DOCUMENTS

| | | | | |
|---|---|---|---|---|
| 2007/0263364 | A1* | 11/2007 | Kawabe | ............ H01L 23/49822 361/728 |
| 2013/0319740 | A1* | 12/2013 | Sato | ....................... H05K 1/185 174/258 |

FOREIGN PATENT DOCUMENTS

JP    2010-171413    8/2010

* cited by examiner

*Primary Examiner* — Binh Tran
(74) *Attorney, Agent, or Firm* — Oblon, McClelland, Maier & Neustadt, L.L.P.

(57) ABSTRACT

A wiring board with a built-in electronic component includes a core substrate, an electronic component in the substrate, a first upper-layer structure on first surface of the substrate, a second upper-layer structure on second surface of the substrate, and via conductors in the substrate and first upper-layer structure such that the via conductors are connected to an electrode of the component. The substrate has an accommodating layer, a first connection layer on first surface of the accommodating layer, and a second connection layer on second surface of the accommodating layer, the accommodating layer includes inner wiring and insulation layers and has cavity accommodating the component, the first connection layer includes inner wiring and insulation layers, and the second connection layer includes inner wiring and insulation layers such that the second connection layer includes greater number of inner wiring and insulation layers than the first connection layer.

20 Claims, 15 Drawing Sheets

WIRING BOARD WITH BUILT-IN ELECTRONIC COMPONENT

CROSS-REFERENCE TO RELATED APPLICATIONS

The present application is based upon and claims the benefit of priority to Japanese Patent Application No. 2013-165662, filed Aug. 9, 2013, the entire contents of which are incorporated herein by reference.

BACKGROUND OF THE INVENTION

Field of the Invention

The present invention relates to a wiring board with a built-in electronic component, more specifically, to a wiring board with a built-in electronic component where an electronic component is built into a cavity formed in an inner layer of the wiring board.

Description of Background Art

An electronic component in a wiring board may be mounted on a surface of the wiring board, or may be mounted in a hole (cavity) formed in the wiring board. JP2010-171413A describes a wiring board with an electronic component mounted in a cavity. The entire contents of this publication are incorporated herein by reference.

SUMMARY OF THE INVENTION

According to one aspect of the present invention, a wiring board with a built-in electronic component includes a core substrate, an electronic component positioned in the core substrate and having surface electrodes, a first upper-layer structure formed on a first surface of the core substrate and including an upper wiring layer and an upper insulation layer, a second upper-layer structure formed on a second surface of the core substrate on the opposite side with respect to the first surface of core substrate and including an upper wiring layer and an upper insulation layer, and via conductors formed in the core substrate and the first upper-layer structure such that the via conductors are connected to one of the surface electrodes of the electronic component. The core substrate has a component-accommodating layer, a first connection layer positioned on a first surface of the component-accommodating layer, and a second connection layer positioned on a second surface on the opposite side with respect to the first surface of the component-accommodating layer, the component-accommodating layer includes inner wiring layers and inner insulation layers and has a cavity accommodating the electronic component, the first connection layer includes an inner wiring layer and an inner insulation layer, the second connection layer includes inner wiring layers and inner insulation layers such that the second connection layer includes a greater number of inner wiring layers and a greater number of inner insulation layers than the first connection layer, and the via conductors are formed through the first connection layer of the core substrate and the first upper-layer structure.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
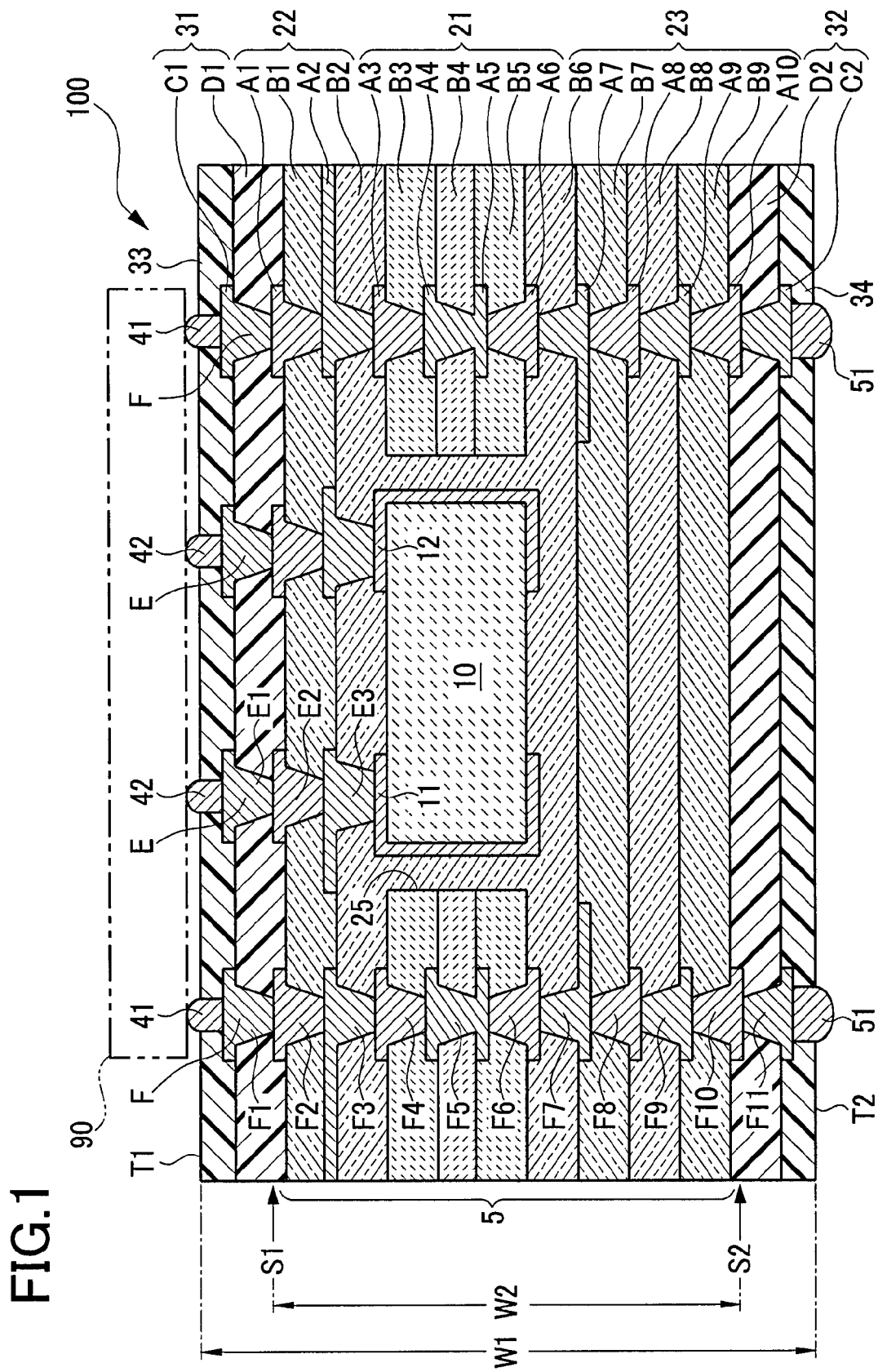
FIG. 1 is a cross-sectional view of a wiring board according to a first embodiment.

The embodiments will now be described with reference to the accompanying drawings, wherein like reference numerals designate corresponding or identical elements throughout the various drawings.

First Embodiment

FIG. 1 shows wiring board 100 according to a first embodiment. As shown in FIG. 1, wiring board 100 of the present embodiment is a multilayer wiring board formed by laminating multiple wiring layers, which are conductive layers with wiring patterns, and insulation layers for insulating wiring layers from each other. Of both end surfaces in a lamination direction, the upper-side surface of wiring board 100 in FIG. 1 is referred to as first main surface (T1), and the lower-side surface opposite first main surface (T1) is referred to as second main surface (T2). As shown in FIG. 1, core substrate 5 is provided in the central portion of wiring board 100 in a lamination direction. The upper-side surface of core substrate 5 in FIG. 1 is set as first surface (S1) and the lower-side surface as second surface (S2). Also, wiring board 100 has upper-layer section 31 formed on first surface (S1) of core substrate 5 and upper-layer section 32 formed on second surface (S2) of core substrate 5. Moreover, on surfaces of wiring board 100, solder-resist layers (33, 34) are provided as protective layers, which are positioned on the upper and lower surfaces respectively of upper-layer sections (31, 32) shown in FIG. 1. In wiring board 100 of the present embodiment shown in FIG. 1, the thicknesses of solder-resist layers (33, 34) in a vertical direction of FIG. 1 are each approximately 21 µm.

Upper-layer section 31 has upper wiring layer (C1) and upper insulation layer (D1). In upper wiring layer (C1), bumps (41, 42) are provided, penetrating through solder-resist layer 33 and protruding upward from first main surface (T1). Upper-layer section 32 has upper wiring layer (C2) and upper insulation layer (D2). In upper wiring layer (C2), bumps 51 are provided, penetrating through solder-resist layer 34 and protruding downward from second main surface (T2). In the present embodiment, the thicknesses of upper wiring layers (C1, C2) are each approximately 15 µm, and the thicknesses of upper insulation layers (D1, D2) are each approximately 25 µm. Therefore, the thicknesses of upper-layer sections (31, 32) are each approximately 40 µm. In addition, an IC chip will be mounted on first main surface (T1) of the final product of wiring board 100 of the present embodiment. IC chip mounting region 90 where the IC chip is to be mounted is shown by a two-dot chain line in FIG. 1. Also, wiring board 100 will be mounted on another board such as a motherboard using its second main surface (T2). Bumps (41, 42, 51) are each for making an external electrical access to wiring board 100.

As shown in FIG. 1, 10 inner wiring layers (A1~A10) and nine inner insulation layers (B1~B9) for insulating those inner wiring layers (A) from each other are formed in core substrate 5 of wiring board 100. In the present embodiment, the thicknesses of inner wiring layers (A1~A10) are each approximately 35 µm, and the thicknesses of inner insulation layers (B1~B9) are each approximately 60 µm. Thus, the thickness of core substrate 5 of the present embodiment shown as (W2) in FIG. 1 is approximately 890 µm. The thicknesses of solder-resist layers (33, 34) and insulation layers (B, D) in the present embodiment each indicate the thickness measured from the surface of their respective wiring layers (A, C).

Cavity 25 is formed in core substrate 5. Core substrate 5 has component-accommodating layer 21, where electronic component 10 is built into cavity 25. Component-accommodating layer 21 is made up of multiple inner wiring layers (A) and inner insulation layers (B). More specifically, component-accommodating layer 21 of the present embodiment is formed with four inner wiring layers (A3~A6) and three inner insulation layers (B3~B5). Thus, the thickness of component-accommodating layer 21 of the present embodiment is approximately 320 µm. Cavity 25 is a penetrating hole which penetrates through inner insulation layers (B3~B5) of component-accommodating layer 21 in a lamination direction.

In the present embodiment, electronic component 10 is a multilayer ceramic capacitor and is referred to as MLCC 10 in the following. MLCC 10 is shaped to be a planar rectangle as a whole, and both of its end surfaces in the left and right directions in FIG. 1 are covered with electrodes (11, 12). Electrodes (11, 12) are conductive portions connected to the inner conductors of MLCC 10. In addition, MLCC 10 of the present embodiment is for supplying power to an IC chip mounted on first main surface (T1) of the final product. MLCC 10 of the present embodiment has a maximum thickness of 330 µm.

The upper portion of core substrate 5 above component-accommodating layer 21 in FIG. 1 is first connection layer 22 made up of inner wiring layers (A1~A2) and inner insulation layers (B1~B2). The lower portion of core substrate 5 below component-accommodating layer 21 in FIG. 1 is second connection layer 23 made up of inner wiring layers (A7~A10) and inner insulation layers (B6~B9). In the present embodiment, the thickness of first connection layer 22 is approximately 190 µm and the thickness of second connection layer 23 is approximately 380 µm.

As shown in FIG. 1, on the upper side of MLCC 10 in FIG. 1, stacked vias (E) are formed to connect bumps 42 and electrodes (11, 12). Stacked vias (E) are structured by stacking filled vias (E1~E3) formed respectively in insulation layers (D1, B1, B2) of first connection layer 22 and upper-layer section 31 positioned on the upper side of MLCC 10 in FIG. 1.

Moreover, in wiring board 100 of the present embodiment, through-stacked vias (F) are provided to connect bump 41 on the first-main-surface (T1) side and bump 51 on the second-main-surface (T2) side. Through-stacked vias (F) make up a through-stacked-via portion structured by stacking filled vias (F1~F11) formed respectively in all the insulation layers (D1, B1~B9, D2) of core substrate 5 and upper-layer sections (31, 32).

In addition, the number of layers in first connection layer 22 made up of inner wiring layers (A1, A2) and inner insulation layers (B1, B2) is set smaller than the number of layers in second connection layer 23 made up of inner wiring layers (A7~A10) and inner insulation layers (B6~B9). More specifically, inner wiring layers (A) and inner insulation layers (B) of first connection layer 22 are each two fewer than those of second connection layer 23. Thus, MLCC 10 is built into a position closer to first surface (S1) than to second surface (S2) of core substrate 5. In addition, the number of upper wiring layers (C) and the number of upper insulation layers (D) are both the same in upper-layer sections 31 and 32 positioned on the upper and lower surfaces of core substrate 5. Accordingly, there are fewer wiring layers and insulation layers laminated on the upper side of MLCC 10 in wiring board 100 of FIG. 1 than are laminated on the lower side of MLCC 10 of FIG. 1. Thus, MLCC 10 is built into a position closer to first main surface (T1) than to second main surface (T2) of wiring board 100 in a lamination direction. Because of the built-in position of MLCC 10 shifted significantly toward the first-main-surface (T1) side, the length of wiring made of stacked vias (E) is shortened between an IC chip mounted on first main surface (T1) and MLCC 10. Accordingly, using wiring board 100 of the present embodiment, change in load and occurrence of noise during operations of a final product are reduced.

Furthermore, effects derived from the built-in position of MLCC 10 significantly shifted toward the first-main-surface (T1) side are greater as the number of laminated layers of core substrate 5 increases. That is because, if MLCC 10 is built into the center of core substrate 5, the length of wiring between an IC chip and MLCC 10 increases in proportion to the number of laminated layers of core substrate 5. When the number of inner insulation layers (B) of core substrate 5 in wiring board 100 is nine or more as in the present embodiment, shifting the built-in position of MLCC 10 significantly toward the first-main-surface (T1) side is especially effective.

As described above, thickness (W2) of core substrate 5 shown in FIG. 1 is approximately 890 µm. In addition, because of the thicknesses of solder-resist layers (33, 34) and upper-layer sections (31, 32), the entire thickness (W1) of wiring board 100 shown in FIG. 1 is approximately 1012 µm. Thus, in wiring board 100 of the present embodiment, the proportion of thickness (W2) of core substrate 5 in the entire thickness (W1) of wiring board 100 is approximately 88%. When the proportion of thickness (W2) of core substrate 5 in the entire thickness (W1) of wiring board 100 is 70% or greater as in the present embodiment, the upper-layer sections (31, 32) in wiring board 100 are not so thick. Thus, the length of wiring between an IC chip and MLCC 10 will not increase much as a result of upper layer section 31.

Thicknesses in wiring board 100 shown in FIG. 1 are each simply an example and are not limited to the thicknesses described above. For example, MLCC 10 with the maximum thickness of 220 μm or 550 μm may also be used. In such a case, the thickness of component-accommodating layer 21 can be adjusted properly in proportion to the thickness of MLCC 10.

Next, steps for manufacturing wiring board 100 of the present embodiment are described. Following steps 1.~6. are employed for manufacturing wiring board 100. The steps are described consecutively below.
1. Preparation of Component-Accommodating Substrate
    1-1. Formation of Cavity
    1-2. Accommodation of MLCC
    1-3. Lamination of Upper and Lower layers on Component-Accommodating Layer
2. Attachment of Support Sheet
3. Laminating Layers on Surface Opposite Support Sheet
4. Removal of Support Sheet
5. Lamination of Upper and Lower Layers of Intermediate Laminate
6. Formation of Upper-Layer Section and Others Preparation of Component-Accommodating Substrate First, a step is described for preparing a component-accommodating substrate that includes component-accommodating layer 21 in wiring board 100 shown in FIG. 1.

Formation of Cavity

Figure 2:
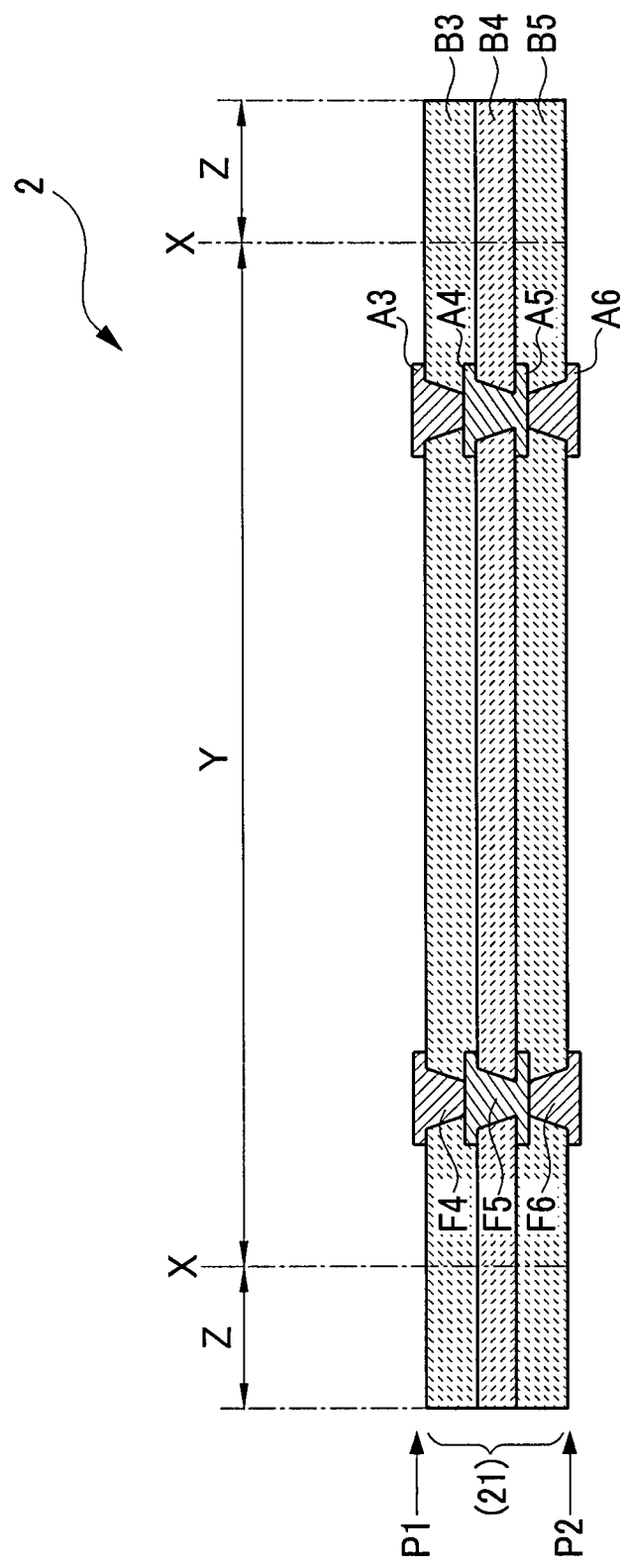
FIG. 2 is a cross-sectional view of a laminated substrate used as a starting material.

FIG. 2 shows laminated substrate 2 to be used as a starting material in the present embodiment. The upper side of FIG. 2 is the first-main-surface (T1) side of wiring board 100 in FIG. 1, and the lower side is the second-main-surface (T2) side. Here, the upper-side surface of FIG. 2 is referred to as first surface (P1) of laminated substrate 2 and the lower-side surface as second surface (P2). Laminated substrate 2 is formed with inner wiring layers (A3~A6) and inner insulation layers (B3~B5). Namely, laminated substrate 2 is the portion to become component-accommodating layer 21 (FIG. 1) in wiring board 100. Laminated substrate 2 is formed by laminating inner wiring layers (A3~A6) with inner insulation layers (B3~B5) each containing glass cloth (core material) disposed between wiring layers. Also, stacked filled vias (F4~F6)) are formed respectively in inner insulation layers (B3~B5).

More specifically, first, inner insulation layer (B4) (containing core material) is prepared with copper foil laminated on both surfaces. Then, penetrating holes are formed using a laser or the like in portions that subsequently become filled vias (F5). Next, copper plating is performed on the entire surface to fill the holes with plating and to form plated layers on surfaces of inner insulation layer (B4). After that, the plated layers on surfaces of inner insulation layer (B4) are patterned so as to form inner wiring layers (A4, A5). Next, prepreg for forming inner insulation layers (B3, B5) is laminated on surfaces of inner insulation layer (B4) with inner wiring layers (A4, A5) formed thereon. Prepreg to be laminated is made by impregnating core material with thermosetting insulative resin such as epoxy resin. Next, heat is applied to cure the laminated prepreg, and inner insulation layers (B3, B5) are formed. Then, holes are formed by a laser or the like in portions that subsequently become filled vias (F4, F6). Next, plating is performed on the entire surface to fill the holes with plating and to form plated layers on surfaces of inner insulation layers (B3, B5).

After that, the plated layers on surfaces of inner insulation layers (B3, B5) are patterned to obtain inner wiring layers (A3, A6). Accordingly, laminated substrate 2 is manufactured.

Figure 3:
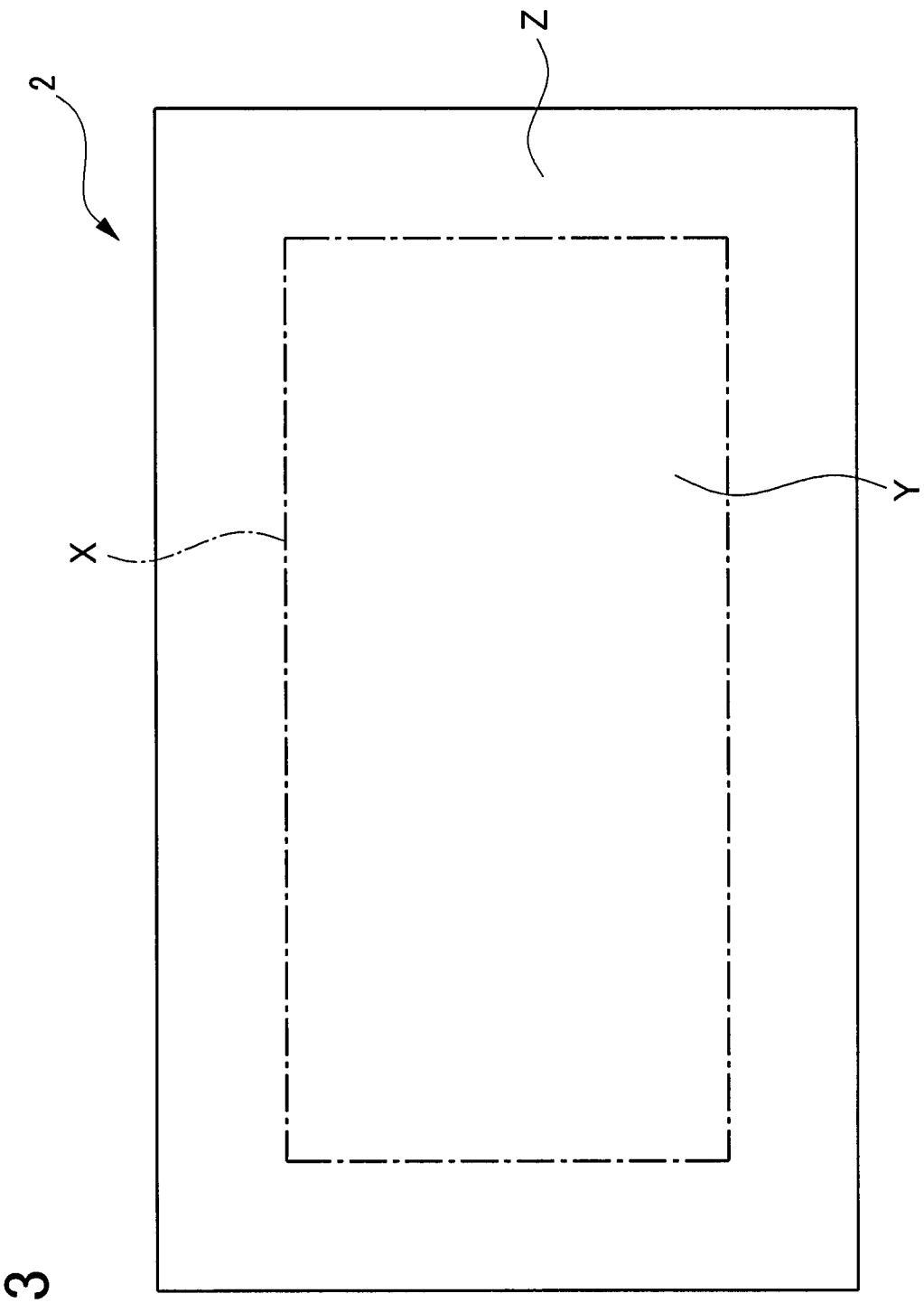
FIG. 3 is a plan view of the laminated substrate.

In addition, laminated substrate 2 has marginal region (Z) shown on the right or left side of dotted line (X) as well as effective region (Y) positioned on the central side of marginal region (Z) as shown in FIG. 2. Upper layers will be laminated on effective region (Y), which subsequently becomes an inner layer of wiring board 100. On the other hand, marginal region (Z) is cut off in a later step of the manufacturing process and will be discarded. FIG. 3 is a plan view of laminated substrate 2, whose cross section is shown in FIG. 2. As shown in FIG. 3, marginal region (Z) in the present embodiment is formed along the periphery of laminated substrate 2 to surround effective region (Y).

Figure 4:
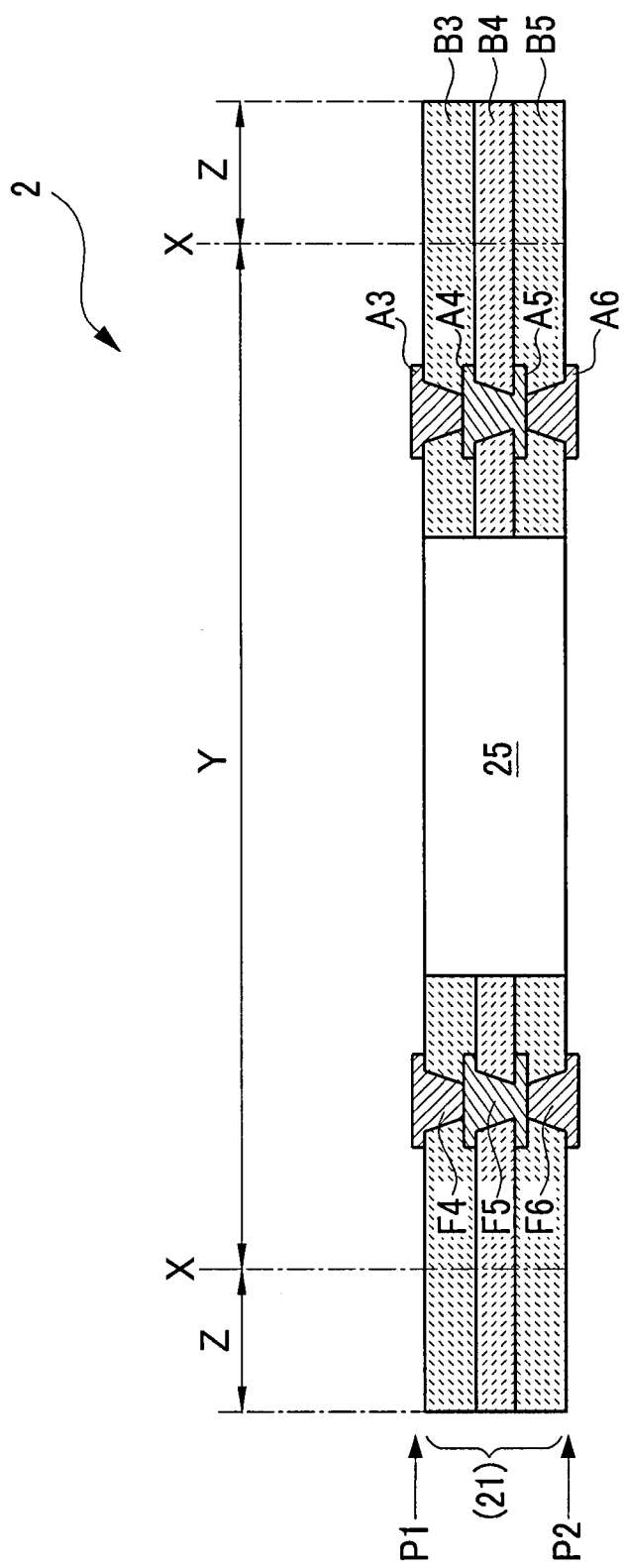
FIG. 4 is a cross-sectional view showing a state where a cavity is formed in the laminated substrate.

A laser or the like is used to form a penetrating hole in laminated substrate 2 in a state shown in FIG. 2, and cavity 25 is formed as shown in FIG. 4. Cavity 25 is formed inside effective region (Y) of laminated substrate 2 as shown in FIG. 4. After cavity 25 is formed, desmearing treatment is performed to remove contaminants generated during the process for forming the cavity.

Accommodation of MLCC

Figure 5:
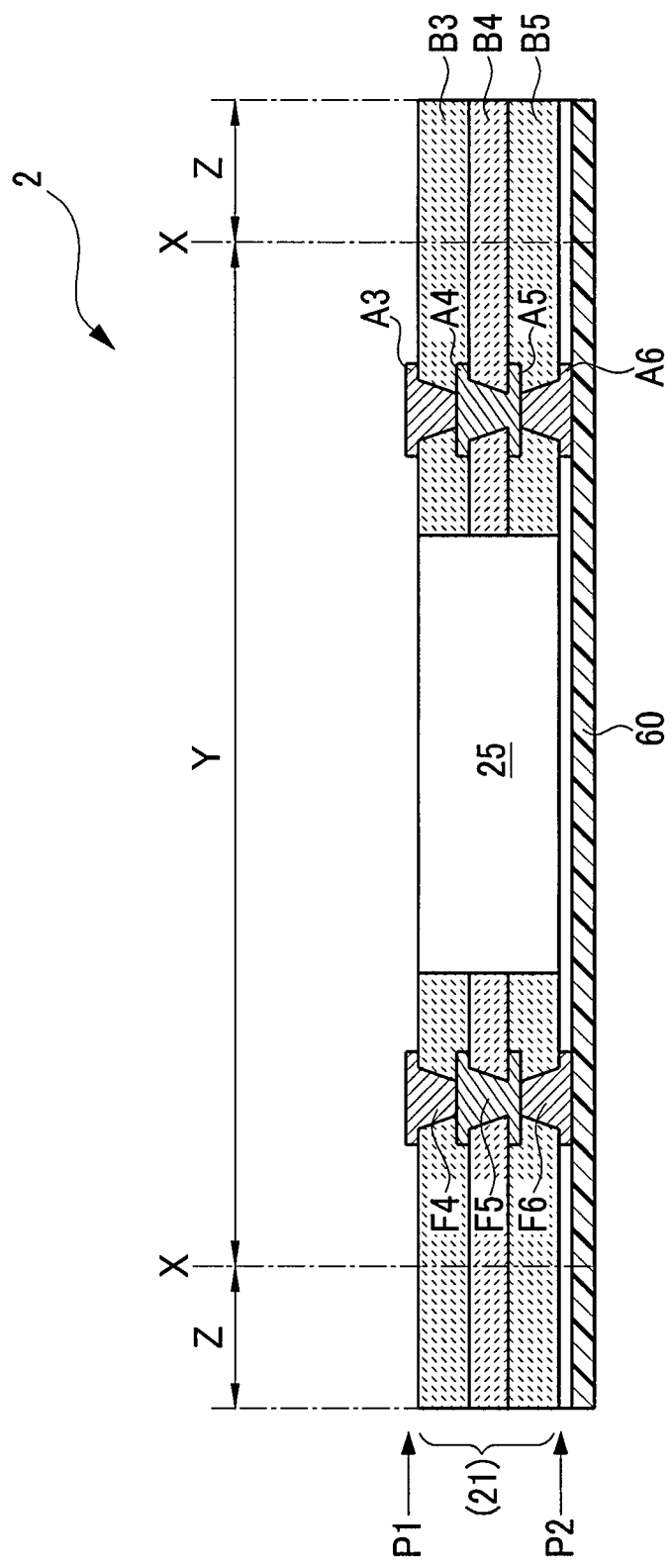
FIG. 5 is a cross-sectional view showing a state where adhesive tape is laminated on the laminated substrate.
Figure 6:
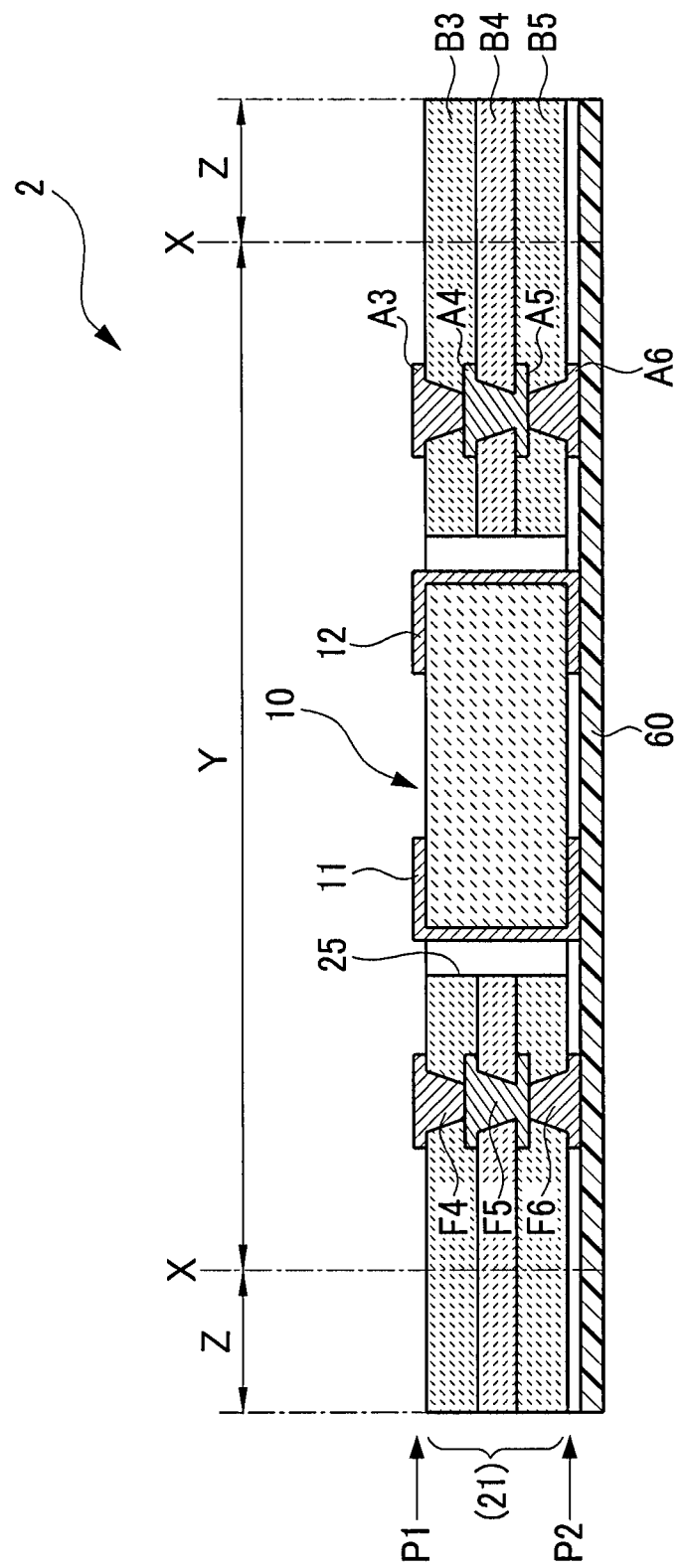
FIG. 6 is a cross-sectional view showing a state where an MLCC is accommodated in the cavity of the laminated substrate.

Next, MLCC 10 is accommodated in cavity 25 of laminated substrate 2. First, adhesive tape 60 is laminated on second surface (P2) of laminated substrate 2 to prepare a state shown in FIG. 5. The entire surface of one side of adhesive tape 60 is adhesive. The adhesive side is positioned to face second surface (P2) of laminated substrate 2. Examples of adhesive tape 60 are PET film and the like. Then, MLCC 10 is accommodated in cavity 25 prepared as shown in FIG. 5 to obtain a state shown in FIG. 6. MLCC 10 in FIG. 6 is preliminarily fixed in the cavity as its surface on the lower side of the drawing is laminated on the adhesive surface of adhesive tape 60. It is also an option for adhesive tape 60 to be laminated on the first-surface (P1) side of laminated substrate 2.

Lamination of Upper and Lower Layers of Component-Accommodating Layer

Figure 7:
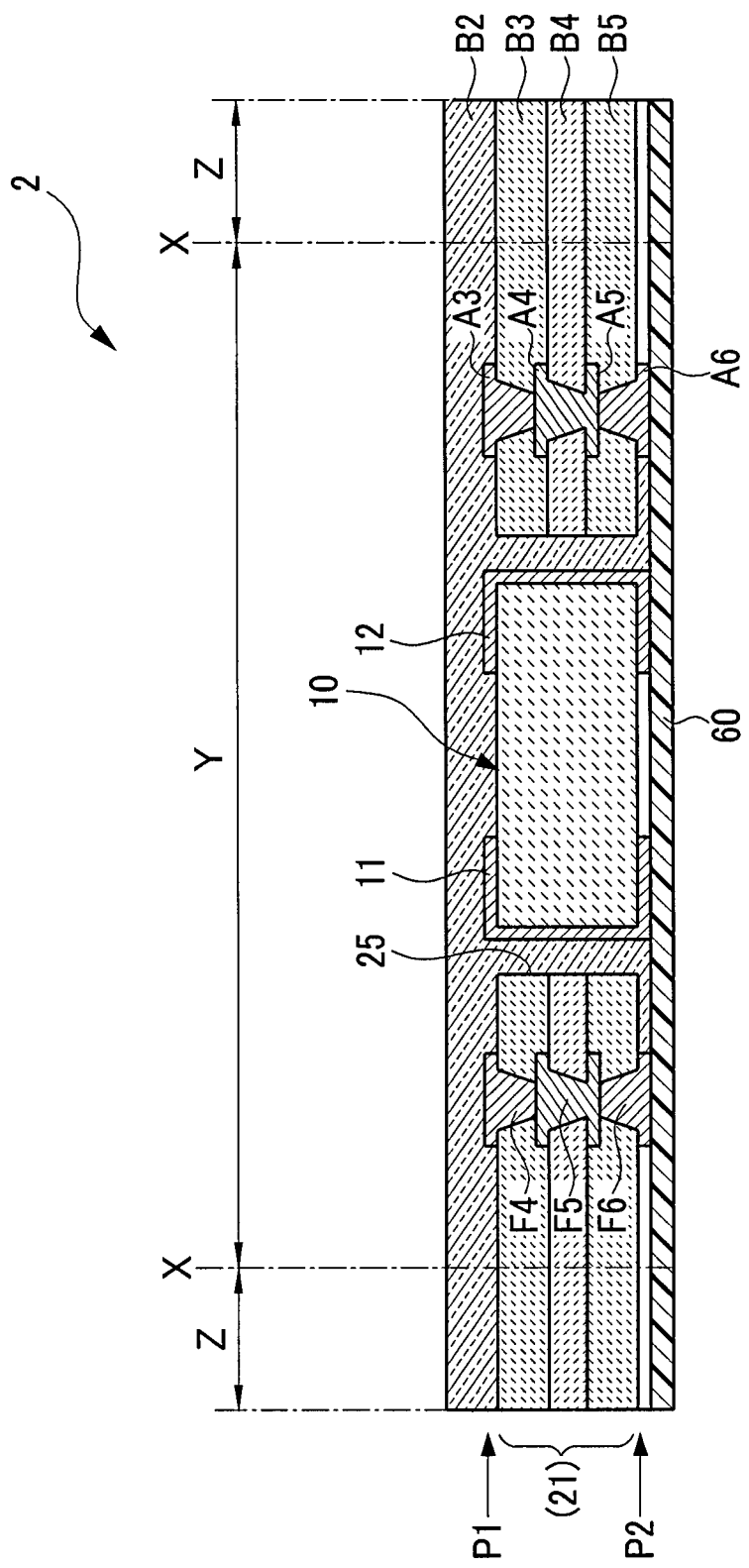
FIG. 7 is a cross-sectional view showing a state where an insulation layer is formed on a surface of the laminated substrate opposite the adhesive tape.
Figure 8:
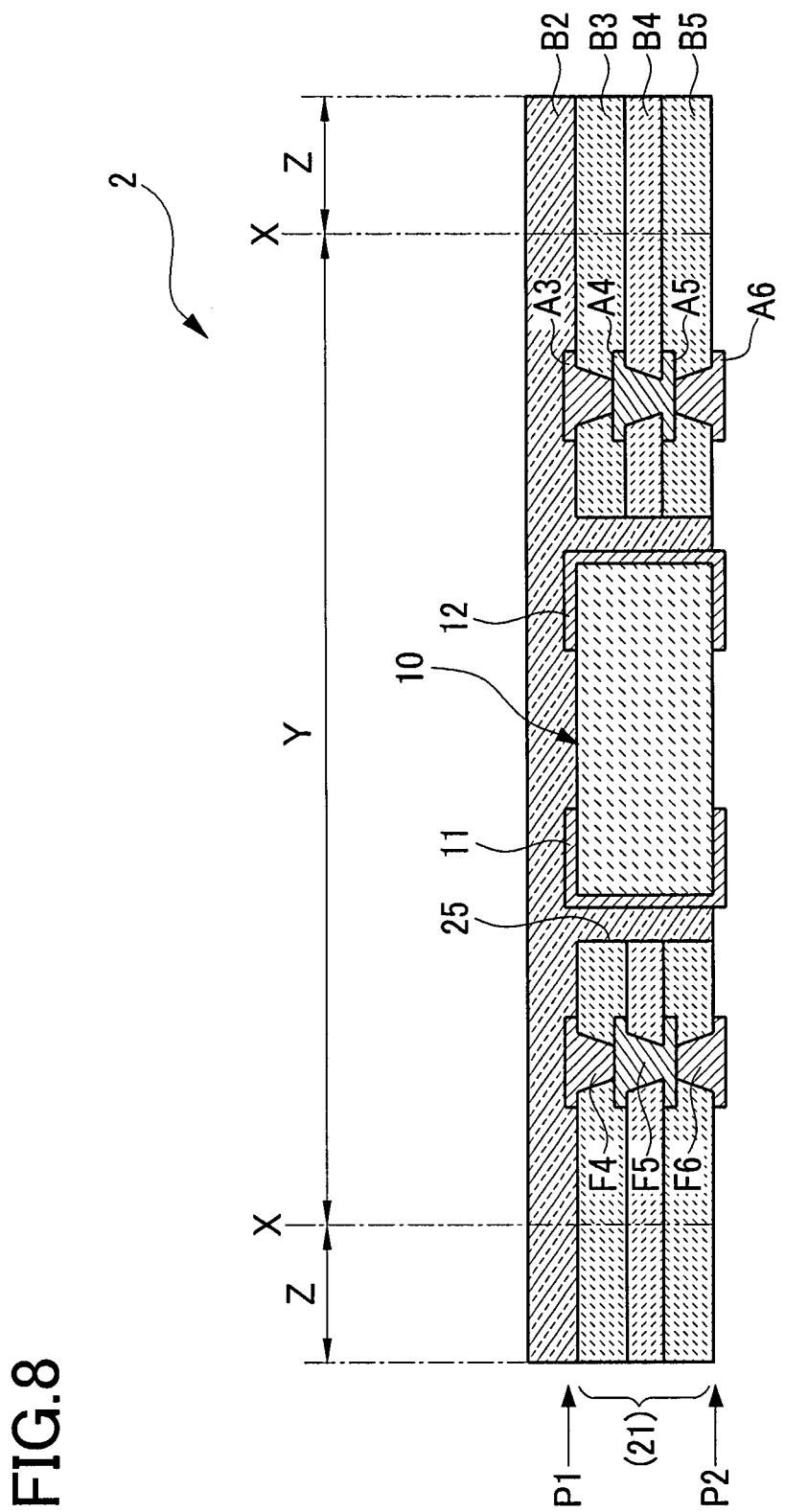
FIG. 8 is a cross-sectional view showing a state where the adhesive tape has been removed from the laminated substrate.
Figure 9:
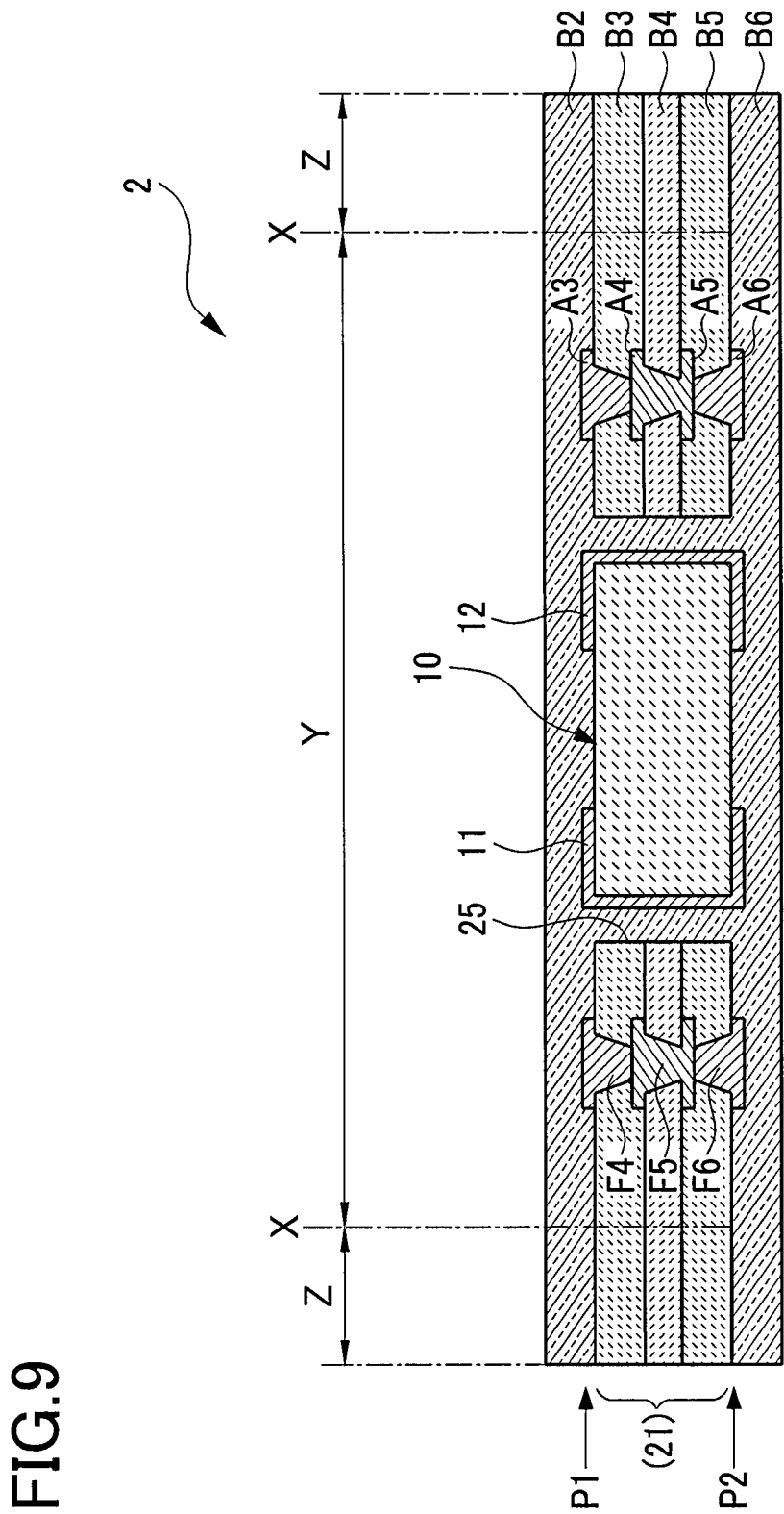
FIG. 9 is a cross-sectional view showing a state where an insulation layer is formed on the surface of the laminated substrate from which the adhesive tape has been removed.

Next, insulation layers and the like are formed respectively on first surface (P1) and second surface (P2) of laminated substrate 2. For that purpose, prepreg containing core material is laminated on first surface (P1) and second surface (P2) of laminated substrate 2 in the present embodiment. More specifically, first, prepreg is laminated on first surface (P1) of laminated substrate 2 prepared as shown in FIG. 6 to obtain a state shown in FIG. 7. In FIG. 7, inner insulation layer (B2) is formed on first surface (P1) of laminated substrate 2. In addition, portions except for MLCC 10 in cavity 25 are filled with part of the resin of the prepreg laminated on first surface (P1). Next, after adhesive tape 60 is removed (FIG. 8), prepreg is laminated on second surface (P2) of laminated substrate 2 to obtain a state shown in FIG. 9. In FIG. 9 laminated substrate 2 has inner insulation layer (B6) formed on second surface (P2) in addition to inner insulation layer (B2) formed on first surface (P1).

Next, inner insulation layers (B2, B6) are cured. Namely, after the above lamination process, laminated substrate 2 is heated to cure the thermosetting resin. Accordingly, the position of MLCC 10 is fixed as shown in FIG. 9. Then, wiring layers and filled vias are formed for inner insulation layers (B2, B6) respectively to obtain a state shown in FIG. 10. Filled vias (E3, F3, F7) are respectively formed in inner insulation layers (B2, B6) shown in FIG. 10. Those filled vias (E3, F3, F7) are respectively connected to inner wiring layers (A2, A7) formed on the surfaces of inner insulation layers (B2, B6).

Figure 10:
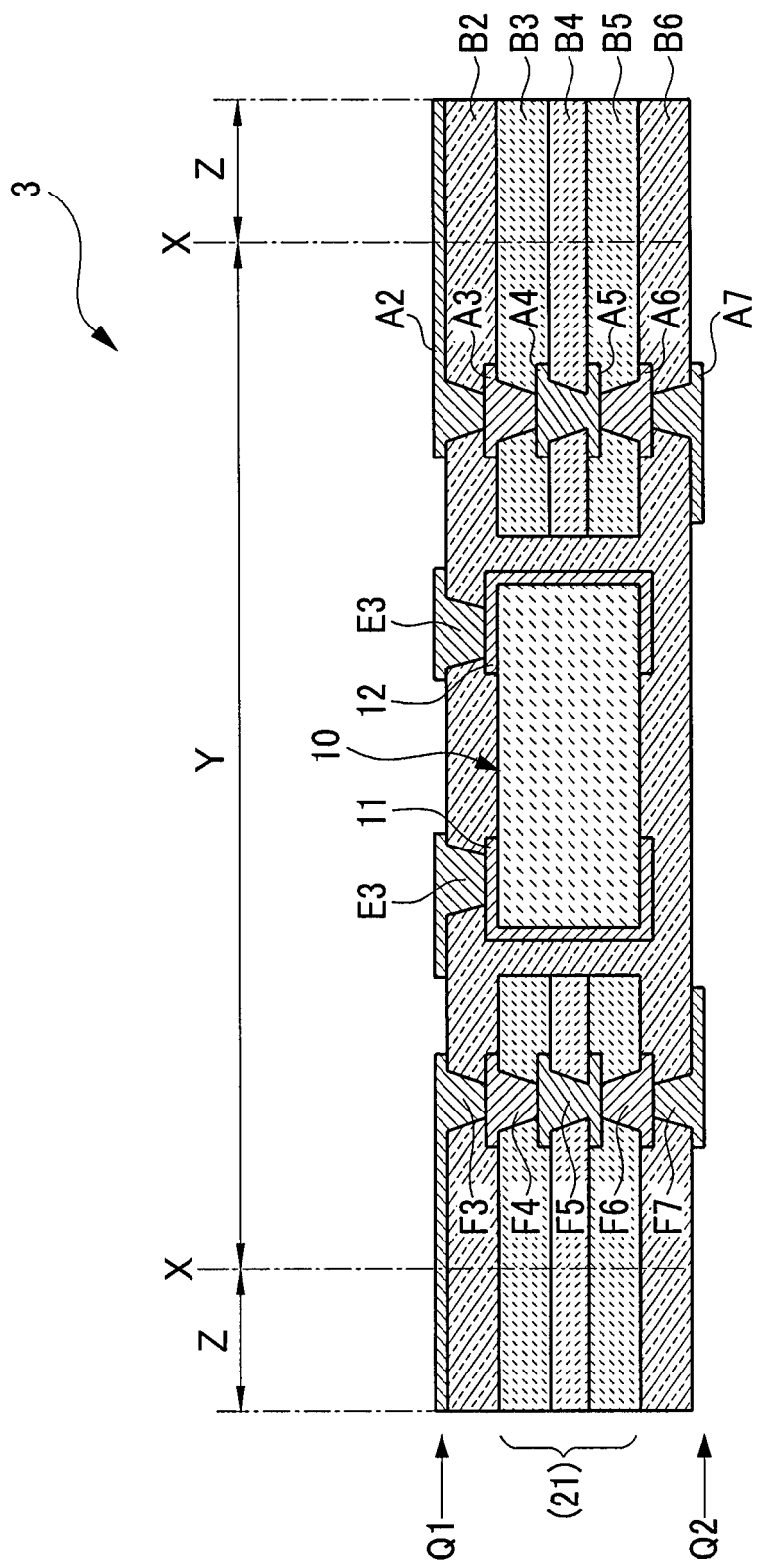
FIG. 10 is a cross-sectional view of a component-accommodating substrate.

In addition, filled vias (E3) in inner insulation layer (B2) are connected to the upper-side surfaces of electrodes (11, 12) of MLCC 10 as shown in FIG. 10. Moreover, filled vias (F3, F7) in inner insulation layers (B2, B6) are stacked directly on filled vias (F4, F6) in inner insulation layers (B3, B5) positioned respectively on the lower side. Inner wiring layers (A2, A7) as well as filled vias (E3, F3, F7) are formed by plating. Namely, holes are made by a laser or the like in portions that subsequently become filled vias (E3, F3, F7) in inner insulation layers (B2, B6), and after plating for filling the holes is performed on the entire surface, the plated layers on surfaces of inner insulation layers (B2, B6) are patterned.

Accordingly, component-accommodating substrate 3 shown in FIG. 10 is obtained. Inner wiring layer (A2) and inner insulation layer (B2) formed in the present step are part of first connection layer 22 positioned on the upper side of component-accommodating layer 21 in wiring board 100 shown in FIG. 1. Also, inner wiring layer (A7) and inner insulation layer (B6) are part of second connection layer 23 on the lower side of component-accommodating layer 21 on wiring board 100 of FIG. 1. Namely, component-accommodating substrate 3 shown in FIG. 10 is in a stage that includes component-accommodating layer 21, and part of first connection layer 22 and second connection layer 23 are formed on upper and lower surfaces respectively. Also, as for the obtained component-accommodating substrate 3 shown in FIG. 10, the upper-side surface of the drawing is set as first surface (Q1) and the lower-side surface as second surface (Q2). First surface (Q1) of component-accommodating substrate 3 is on the first-main-surface (T1) side of wiring board 100 shown in FIG. 1, and second surface (Q2) is on the second-main-surface (T2) side of wiring board 100.

Attachment of Support Sheet

Figure 11:
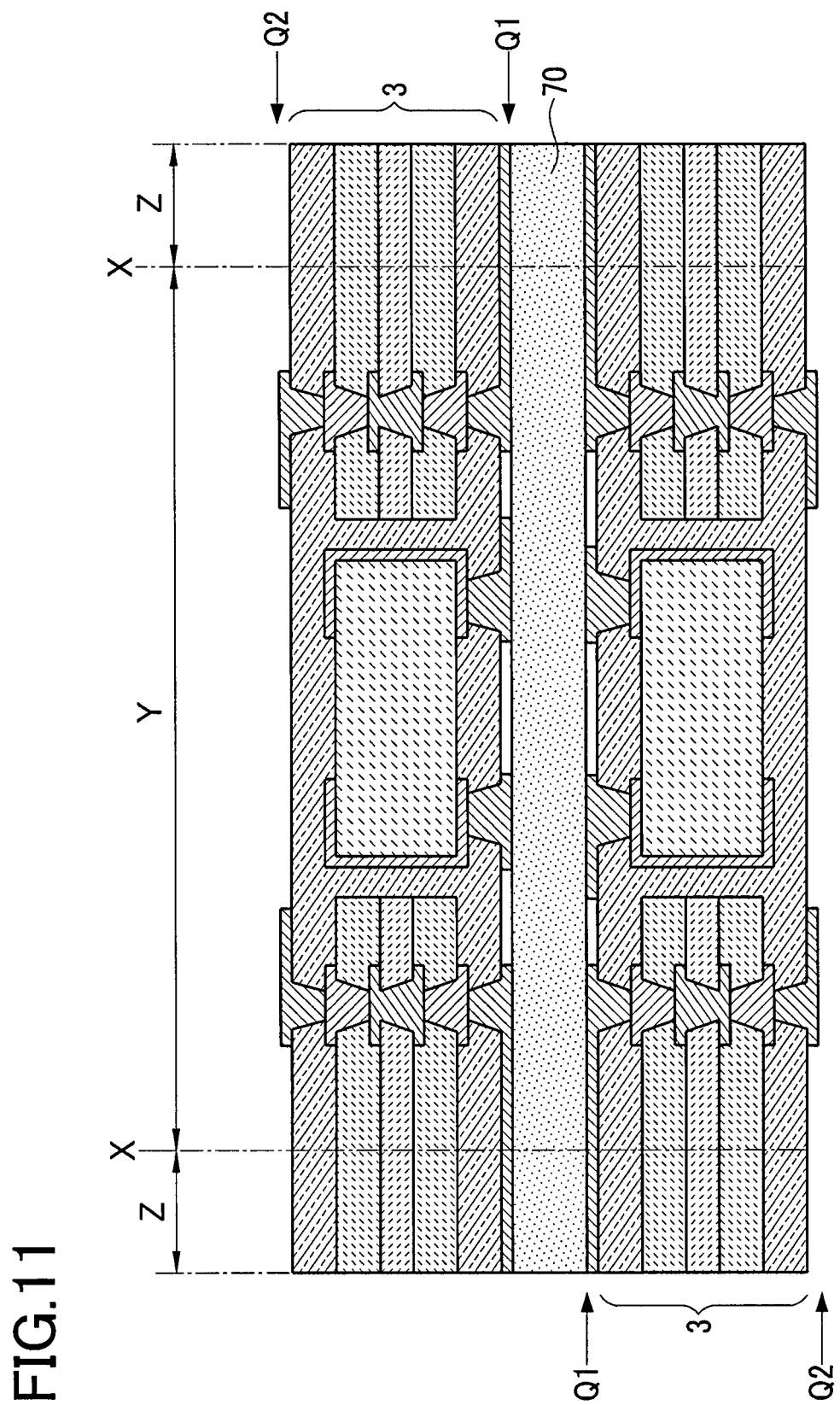
FIG. 11 is a cross-sectional view showing a state where component-accommodating substrates are attached to a support sheet.

Next, component-accommodating substrate 3 is attached to support sheet 70 to obtain a state shown in FIG. 11. Component-accommodating substrate 3 is attached to each of both the upper and lower sides of support sheet 70 in FIG. 11. Both the upper and lower sides of support sheet 70 face first surface (Q1) of each component-accommodating substrate 3 in FIG. 11. Therefore, both upper- and lower-side surfaces of support sheet 70 shown in FIG. 11 are adhesive. However, the upper and lower surfaces of support sheet 70 are not entirely adhesive. Namely, the portion facing effective region (Y) of component-accommodating substrate 3 is not adhesive, and only the portion facing marginal region (Z) is adhesive. In addition, unlike adhesive tape 60 described above (FIG. 5 and the like), support sheet 70 is made of highly rigid material such as a double-sided copper-clad laminate or a metal sheet.

Lamination on Surface Opposite Support Sheet

Figure 12:
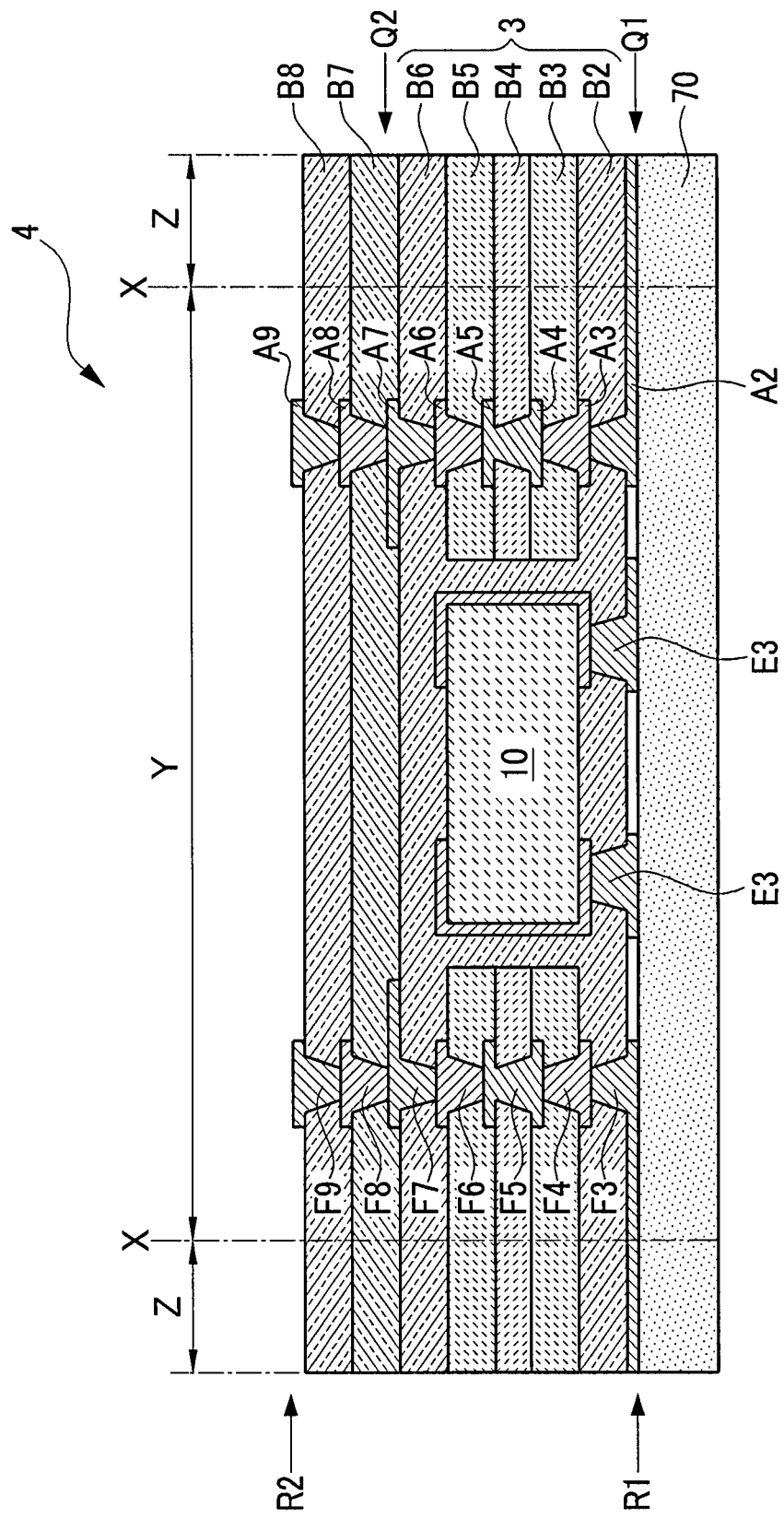
FIG. 12 is a cross-sectional view showing a state where layers are laminated on a surface of the component-accommodating substrate opposite the support sheet.

Next, insulation layers and wiring layers are laminated on second surface (Q2) of component-accommodating substrate 3 attached to support sheet 70 to obtain a state shown in FIG. 12. Here, component-accommodating substrate 3 on the lower side of support sheet 70 is omitted in and subsequent to FIG. 12, and only component-accommodating substrate 3 on the upper side of support sheet 70 is described. The state in FIG. 12 is obtained by laminating consecutively upward from second surface (Q2) of component-accommodating substrate 3.

Namely, on second surface (Q2) of component-accommodating substrate 3, prepreg containing core material for forming inner insulation layer (B7) is laminated first. Next, heat is applied to cure the laminated prepreg, and inner insulation layer (B7) is formed. Then, holes are made by a laser or the like in portions that subsequently become filled vias (F8) in inner insulation layer (B7). Next, plating is performed to fill the holes with plating and to form a plated layer on the surface of inner insulation layer (B7). Then, the plated layer on the surface of inner insulation layer (B7) is patterned to obtain inner wiring layer (A8). Accordingly, inner wiring layer (A8) and inner insulation layer (B7) are formed on second surface (Q2) of component-accommodating substrate 3.

Moreover, by employing the same procedures as for inner wiring layer (A8) and inner insulation layer (B7), inner wiring layer (A9) and inner insulation layer (B8) are formed. Filled vias (F9) in inner insulation layer (B8) are also formed by the same procedures taken for filled vias (F8) in inner insulation layer (B7). Then, as shown in FIG. 12, filled vias (F8, F9) in inner insulation layers (B7, B8) formed in the present step are stacked directly on filled vias (F7) in inner insulation layer (B6).

Accordingly, laminate 4 is obtained as shown in FIG. 12. Timer wiring layers (A8, A9) and inner insulation layers (B7, B8) formed in the present step are part of second connection layer 23 of wiring board 100 shown in FIG. 1. Also, in first connection layer 22, there are two fewer inner wiring layers (A) and inner insulation layers (B) respectively than in second connection layer 23 as described above, and inner wiring layers (A8, A9) and inner insulation layers (B7, B8) laminated in the present step are respectively the two layers that make the number of layers greater in second connection layer 23 than in first connection layer 22. As for laminate 4 in FIG. 12, the lower-side surface in the drawing is set as first surface (R1) and the upper-side surface as second surface (R2). First surface (R1) of laminate 4 is on the first-main-surface (T1) side of wiring board 100 shown in FIG. 1, and second surface (R2) is on the second-main-surface (T2) side of wiring board 100. Although omitted in FIG. 12, on second surface (Q2) of component-accommodating substrate 3 on the lower side of support sheet 70, part of second connection layer 23 is also formed the same as on second surface (Q2) of component-accommodating substrate 3 on the upper side of support sheet 70 so as to obtain laminate 4. Regarding laminate 4 on the lower side of support sheet 70, its upper-side surface is set as first surface (R1) and its lower-side surface as second surface (R2).

Removal of Support Sheet

Figure 13:
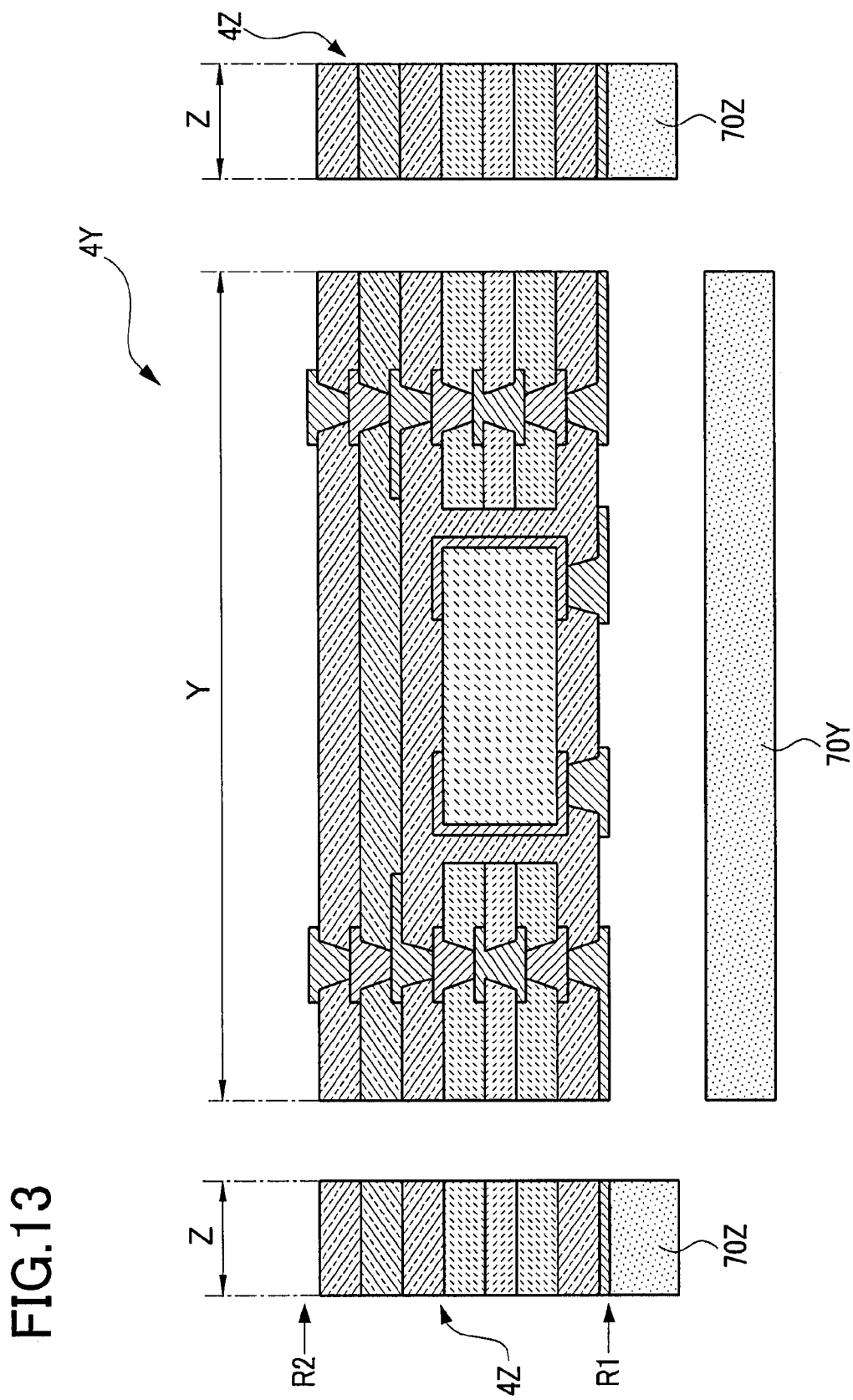
FIG. 13 is a cross-sectional view of an intermediate laminate taken out by edge processing.

After the above procedures, support sheet 70 is removed from laminate 4 shown in FIG. 12. Support sheet 70 is removed together with laminate 4 by conducting edge processing along effective region (Y) of laminate 4. Namely, for example, a cutting tool longer than the length, obtained by totaling the thickness of support sheet 70 and the thicknesses of laminates 4 on its upper and lower sides, is moved in marginal region (Z) of laminate 4 along (X), which is the outline of effective region (Y). Accordingly, as shown in FIG. 13, portions of laminate 4 and support sheet 70 except for effective region (Y) are cut off as laminate (4Z) and support sheet (70Z)

As described above, the surface of support sheet 70 is adhesive only in the portion facing marginal region (Z) of laminate 4. Thus, as shown in FIG. 13, intermediate laminate (4Y) corresponding to effective region (Y) of laminate 4 is separated from support sheet (70Y) which is the portion in effective region (Y) of support sheet 70, because the portion of support sheet (70Y) facing first surface (R1) of intermediate laminate (4Y) is not adhesive. Therefore, intermediate laminate (4Y) can be taken out. Also, regarding laminate 4 on the lower side of support sheet 70 omitted in FIG. 13, intermediate laminate (4Y) corresponding to effective region (Y) is also taken out. Laminate (4Z), support sheet (70Z) and support sheet (70Y) are discarded after edge cutting.

Lamination of Upper and Lower Layers on Intermediate Laminate

Figure 14:
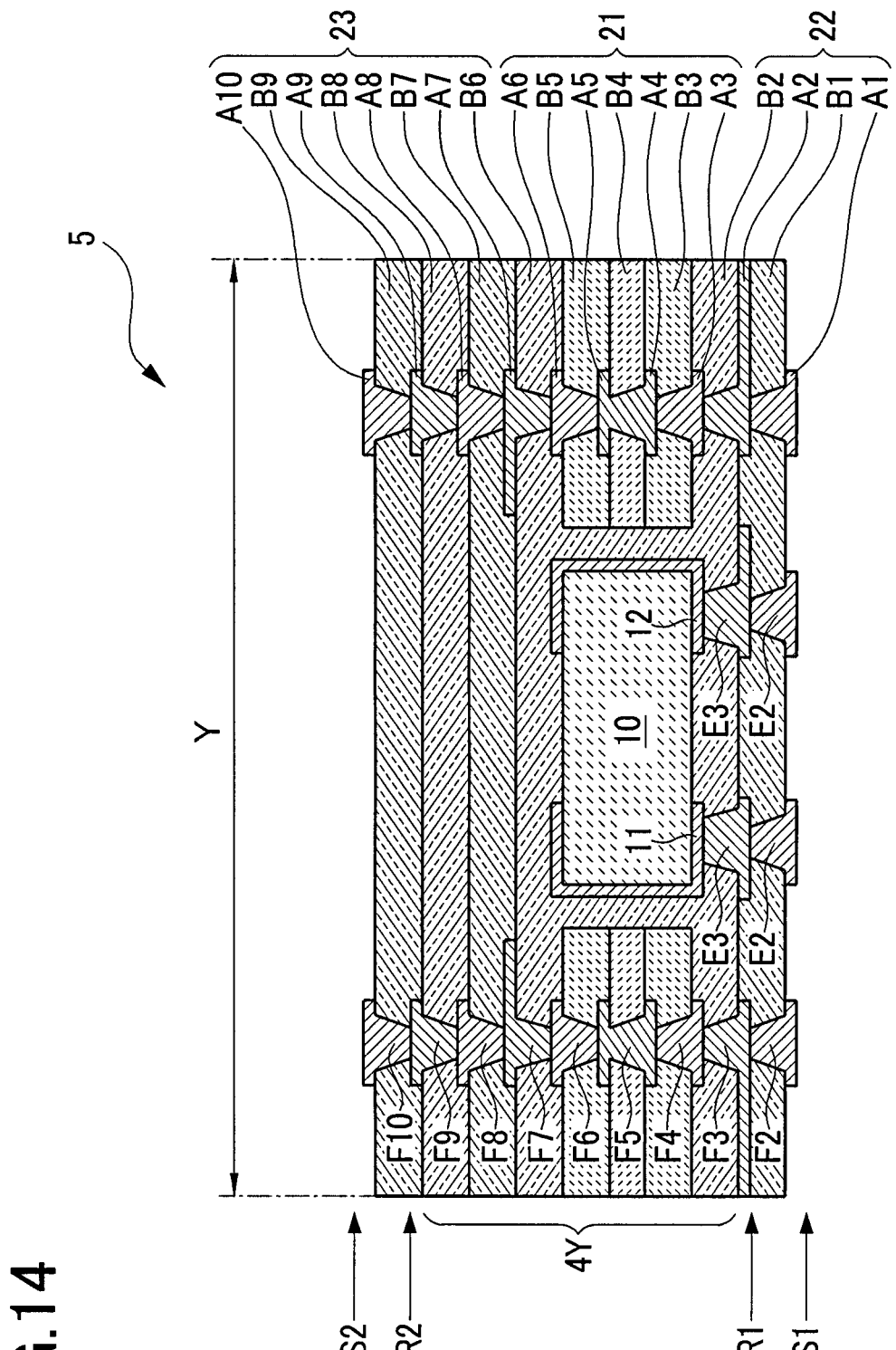
FIG. 14 is a cross-sectional view of a core substrate.

On intermediate laminate (4Y) cut out above (FIG. 13), the rest of first connection layer 22 and second connection layer 23 are laminated to produce core substrate 5 (FIG. 14). Namely, prepreg containing core material to become inner insulation layers (B1, B9) is laminated on each of first surface (R1) and second surface (R2) of intermediate laminate (4Y). Heat is applied to cure the laminated prepreg, and inner insulation layers (B1, B9) are formed. Then, holes are made by a laser or the like in portions that subsequently become filled vias (E2, F2, F10) respectively. Next, plating is performed to fill the holes with plating and form plated layers on the surfaces on inner insulation layers (B1, B9). After that, plated layers on the surfaces of inner insulation layers (B1, B9) are patterned to obtain inner wiring layers (A1, A10) on their respective surfaces. Accordingly, core substrate 5 is obtained, having component-accommodating layer 21, first connection layer 22 and second connection layer 23. Regarding core substrate 5 in FIG. 14, the lower-side surface in the drawing is set as first surface (S1) and the upper-side surface as second surface (S2). First surface (S1) of core substrate 5 is on the first-main-surface (T1) side of wiring board 100 shown in FIG. 1, and second surface (S2) is on the second-main-surface (T2) side of wiring board 100 (FIG. 1).

Forming Upper-Layer Section and Others

Next, the rest is formed on core substrate 5 (FIG. 14) to complete wiring board 100 (FIG. 1). Namely, upper-layer sections (31, 32), solder-resist layers (33, 34) and bumps (41, 42, 51) are formed on core substrate 5.

To form upper-layer sections (31, 32), first, resin film to make upper-insulation layers (D1, D2) is laminated on first surface (S1) and second surface (S2) of core substrate 5. The resin film used here is made of thermosetting insulative resin that does not contain core material. Then, heat is applied to cure the laminated resin film, and upper insulation layers (D1, D2) are formed. Then, holes are made by a laser or the like in portions that subsequently become filled vias (E1, F1, F11). Next, plating is performed to fill the holes with plating and to form plated layers on surfaces of upper insulation layers (D1, D2). Then, the plated layers on surfaces of upper insulation layers (D1, D2) are patterned to obtain upper wiring layers (C1, C2).

Filled vias (E1) in upper insulation layer (D1) are stacked directly on filled vias (E2) in inner insulation layer (B1) on the lower side. Accordingly, stacked vias (E) are formed to electrically connect bumps 42 and electrodes (11, 12) of electronic component 10. Also, filled vias (F1, F11) in upper insulation layers (D1, D2) are respectively stacked directly on filled vias (F2, F10) in insulation layers (B1, B9) on the lower side. Accordingly, through-stacked vias (F) are formed to electrically connect bumps 41 and bumps 51.

After the above procedures, solder-resist layers (33, 34) are formed on upper-layer sections (31, 32) while portions of upper-wiring layers (C1, C2) for forming bumps (41, 42, 51) are exposed, and bumps (41, 42, 51) are formed on the exposed portions of upper wiring layers (C1, C2). Accordingly, wiring board 100 shown in FIG. 1 is obtained.

In the above steps for manufacturing wiring board 100, lamination is conducted on second surface (Q2) while first surface (Q1) of component-accommodating substrate 3 is still attached to support sheet 70 (FIG. 12). That is for suppressing warping caused by differences in stress on the first-surface (Q1) side and the second-surface (Q2) side of component-accommodating substrate 3 when stress is generated by lamination on second surface (Q2). Therefore, to securely suppress warping in component-accommodating substrate 3, the rigidity of support sheet 70 is preferred to be higher than that of the laminated section on second surface (Q2) of component-accommodating substrate 3.

Furthermore, core substrate 5 is manufactured by laminating the same number of inner wiring layers (A) and the same number of inner insulation layers (B) on first surface (R1) and second surface (R2) of intermediate laminate (4Y) (FIG. 14). In addition, wiring board 100 is manufactured by laminating the same number of inner wiring layers (C) and the same number of inner insulation layers (D) on first surface (S1) and second surface (S2) of core substrate 5. Namely, after support sheet 70 has been removed, the number of wiring layers and the number of insulation layers to be laminated on upper and lower surfaces are the same. Accordingly, no difference in stress occurs as a result of lamination, and wiring board 100 does not warp.

In the present embodiment, component-accommodating substrate 3 is attached to each of the upper and lower sides of support sheet 70 (FIG. 11) to form laminates 4 (FIG. 12). Accordingly, two intermediate laminates (4Y) are obtained using one support sheet 70, thereby enhancing the productivity of wiring board 100. It is also an option to attach component-accommodating substrate 3 to only one side of support sheet 70 to form intermediate laminate (4Y).

Second Embodiment

Figure 15:
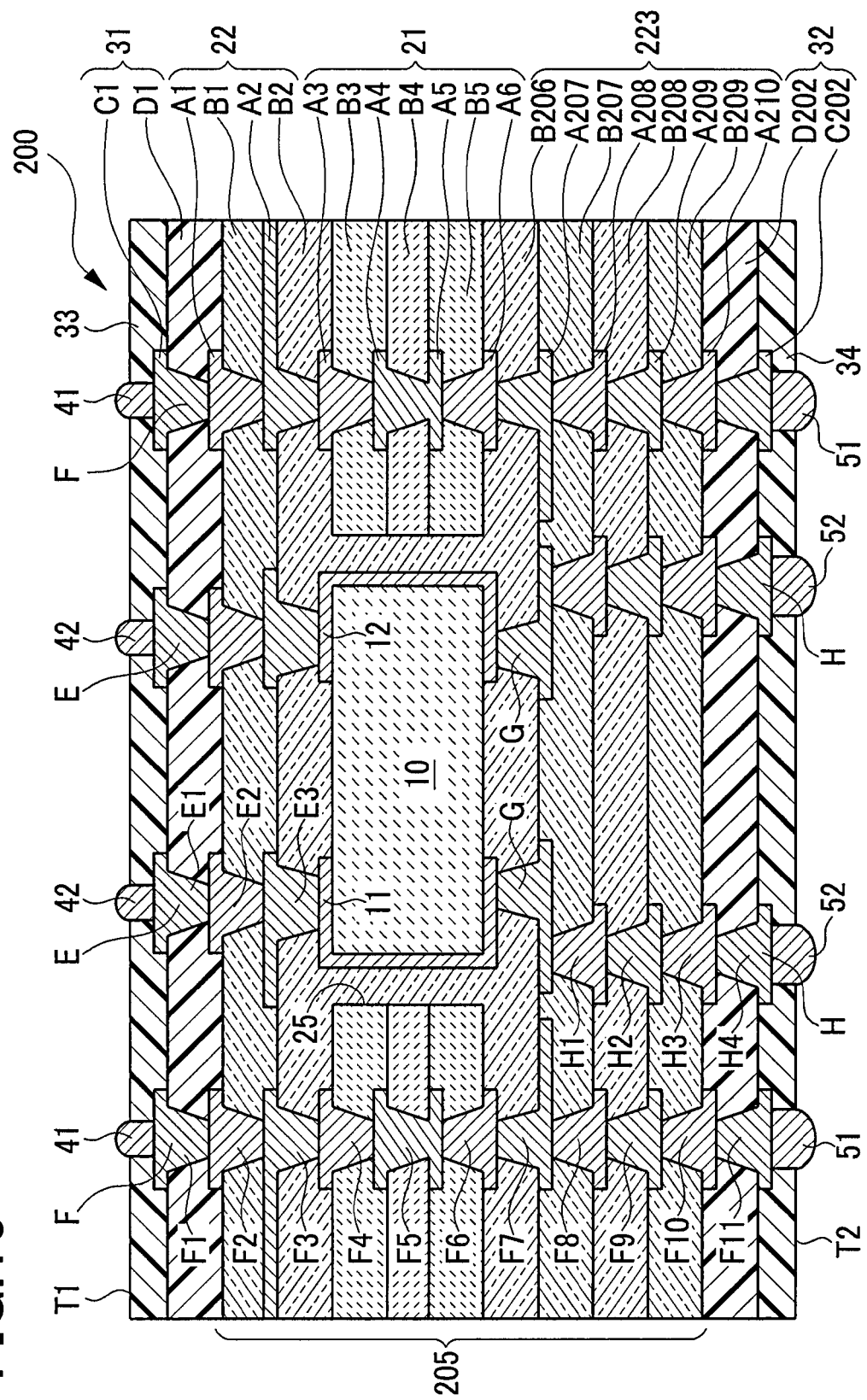
FIG. 15 is a cross-sectional view of a wiring board according to a second embodiment.

A second embodiment is described. FIG. 15 shows wiring board 200 of the second embodiment. As shown in FIG. 15, wiring board 200 of the present embodiment has filled vias (G), stacked vias (H) and bumps 52 in addition to the structure of wiring board 100 according to the first embodiment (FIG. 1). Bumps 52 are for external electrical access to wiring board 100, and are formed on upper wiring layer (C202) to penetrate through solder-resist layer 34 and to protrude downward from second main surface (T2).

Filled vias (G) and stacked vias (H) are provided on the lower side of MLCC 10 in FIG. 15, and are for connecting electrodes (11, 12) to bumps 52. Filled vias (G) are formed in inner insulation layer (B206) of second connection layer 223. Stacked vias (H) are formed by stacking filled vias (H1~H4) formed respectively in second connection layer 223 and insulation layers (B207~B209, D202) of upper-layer section 32 positioned on the lower side of inner insulation layer (B206) in FIG. 15. Filled vias (G) connect electrodes (11, 12) of MLCC 10 and inner wiring layer (A207). Stacked vias (H) connect inner wiring layer (A207) and bumps 52.

As shown in FIG. 15, filled via (G) and stacked vias (H) are offset when they are connected at inner wiring layer (A207) by shifting their respective centers from each other. That is because if many vias are stacked, stress tends to be generated. Namely, since the built-in position of MLCC 10 is shifted significantly toward the first-main-surface (T1) side in the present embodiment, more insulation layers are laminated on the second-main-surface (T2) side of MLCC 10 than on the first-main-surface (T1) side. Thus, to connect bumps 52 on the second-main-surface (T2) side and MLCC 10, more vias are needed than to connect bumps 42 and MLCC 10 on the first-main-surface (T1) side. Then, if all the vias for connection with bumps 52 on the second-main-surface (T2) side of MLCC 10 are stacked, connection failure may occur due to stress generated especially in connection portions of electrodes (11, 12) and vias in inner insulation layer (B206) formed on electrode surfaces, because they are made of different materials. Therefore, in wiring board 200 of the present embodiment, filled vias (G) and stacked vias (H) are offset so as to mitigate stress when connecting MLCC 10 and bumps 52 on the second-main-surface (T2) side. Thus, electrical connection reliability is ensured between MLCC 10 and bumps 52. The offset position of vias is not limited to that in FIG. 15. For example, it is an option to stack filled vias in inner insulation layers (B206~B209) of second connection layer 223 and to offset a filled via in upper insulation layer (D202) of upper-layer section 32 from the position of the stacked vias.

Wiring board 200 of the present embodiment is formed by employing the same steps as those for wiring board 100 of the first embodiment. Then, wiring board 200 is formed by adding steps for forming filled vias (G, H1~H4) in inner insulation layers (B206~B209) and upper insulation layer (D202) when second connection layer 223 and upper-layer section 32 are laminated. In addition, inner wiring layers (A207~A210) and upper wiring layer (C202) are formed by patterning them differently from the patterns of inner wiring layers (A7~A10) and upper wiring layer (C2) in the first embodiment. Moreover, inner insulation layers (B206~B209) of core substrate 205 are formed using prepreg containing core material, and upper insulation layer (D202) is formed using resin film that does not contain core material.

As described in detail so far, each of wiring boards (100, 200) according to the embodiments of the present invention includes a core substrate and upper-layer sections provided on its upper and lower surfaces. A core substrate has a component-accommodating layer with an accommodated MLCC and a first connection layer and a second connection layer provided on its upper and lower sides. There are more inner wiring layers (A) and inner insulation layers (B) in the second connection layer than there are in the first connection layer. Accordingly, a multilayer wiring board with a built-in electronic component is formed to have a different number of laminated layers on the upper and lower sides of the component-accommodating layer with an accommodated electronic component. Therefore, the built-in position of MLCC 10 is shifted toward first main surface (T1), and the length of wiring made of stacked vias (E) is shortened between MLCC 10 and an IC chip mounted on first main surface (T1). Namely, an increase in inductance of the wiring connecting an IC chip and MLCC 10 is suppressed, and change in load and occurrence of noise during operations are mitigated.

The present embodiments are described simply to show examples, and do not limit the present invention. Thus, various improvements and modifications are possible within a scope that does not deviate from the gist of the present invention. For example, the electronic component to be accommodated in cavity 25 is not limited to MLCC 10, and may be an inductor, resistor or filter. Also, in the above embodiments, laminated substrate 2 (see FIG. 4 and the like) having three inner insulation layers (B3~B5) was used. However, a laminated substrate having two, or four or more, inner insulation layers (B) may also be used as starting material.

In addition, inner wiring layers and inner insulation layers of first connection layer 22 and second connection layer 23 are set to be two layers and four layers respectively in the above embodiments. However, that is not the only option. For example, first connection layer 22 and second connection layer 23 may have more layers. Also, upper-layer sections 31 and 32 are not limited to being single-layered and may have two or more layers.

When a number of layers laminated on a component-accommodating layer is set to be the same on the upper and lower sides of the component-accommodating layer, a capacitor is built into the component-accommodating layer positioned at the center in a lamination direction of the wiring board. When the number of laminated layers of a wiring board is increased as electronic components have become more functional and diverse in recent years, there are more laminated layers in the upper layer section than in the component-accommodating layer, and the length of wiring between an IC chip and a capacitor becomes longer. As the number of laminated layers increases, the inductance of the wiring between an IC chip and a capacitor increases, thereby causing change in load and occurrence of noise during operations.

A multilayer wiring board with a built-in electronic component according to an embodiment of the present invention has the number of laminated layers which is different on the upper and lower sides of the component-accommodating layer in which an electronic component is accommodated.

A wiring board with a built-in electronic component according to an embodiment of the present invention has a core substrate formed by laminating multiple inner wiring layers and multiple inner insulation layers made of insulative resin containing core material; an electronic component that has surface electrodes and is built into the core substrate; and upper-layer sections formed by laminating upper wiring layers and upper insulation layers and positioned respectively on both upper and lower surfaces of the core substrate. In such a wiring board, the core substrate has a component-accommodating layer formed by laminating multiple inner wiring layers and inner insulation layers and having a cavity for accommodating an electronic component; a first connection layer formed by laminating at least one each of an inner wiring layer and an inner insulation layer and positioned on one surface of the component-accommodating layer; and a second connection layer positioned on the other surface of the component-accommodating layer opposite the first connection layer and formed by laminating more inner wiring layers and inner insulation layers than in the first connection layer. Via conductors for electrical connection with surface electrodes of the electronic component are formed in the inner insulation layer of the first connection layer and in the upper-insulation layer of the upper-layer section positioned on the first-connection-layer side of the component-accommodating layer.

In the core substrate of the wiring board with a built-in electronic component according to an embodiment of the present invention, more inner wiring layers and inner insulation layers are laminated in the second connection layer than in the first insulation layer. Namely, due to the difference in the number of laminated layers on the upper and lower sides of the component-accommodating layer, the built-in position of the electronic component in the wiring board is shifted to one main-surface side. Thus, the length of wiring from the electronic component to one surface of the wiring layer is set shorter, and the inductance of the wiring is reduced accordingly.

In addition, an IC-chip mounting region is preferred to be formed on the first-connection-layer side surface of the above wiring board with a built-in electronic component, because the length of wiring between the IC chip and the electronic component is made shorter.

In the above wiring board with a built-in electronic component, it is also an option to form via conductors in the inner insulation layers and in the upper insulation layers, while those via conductors are formed to include through-stacked vias structured to be stacked from the upper insulation layer of one side through the upper insulation layer of the other side.

Moreover, the above wiring board with a built-in electronic component is preferred to be as follows: the first connection layer is formed by laminating multiple inner wiring layers and inner insulation layers, a first surface-electrode via section is structured by forming via conductors in the insulation layers of the first connection layer for electrical connection with surface electrodes of the electronic component and by stacking all such vias; and a second surface-electrode via section is structured by forming via conductors in the insulation layers of the second connection layer for electrical connection with surface electrodes of the electronic component and by stacking all such vias while including offset vias at least in one part. In the first connection layer with fewer laminated layers, stress will not occur significantly even when all the via conductors are stacked. On the other hand, in the second connection layer with more laminated layers, stress may occur significantly if all the via conductors are stacked. Thus, electrical connection may fail at a connection site between a surface electrode of the electronic component and a via conductor made of materials that are different from each other. Accordingly, at least one part of the stacked via structure in the second connection layer is offset to mitigate stress and to enhance connection reliability between the surface electrode of the electronic component and via conductors.

In the above wiring board with a built-in electronic component, via conductors may be filled vias formed by plating.

Also, in the above wiring board with a built-in electronic component, the number of inner insulation layers in a core substrate is preferred to be nine or more, and the thickness of the core substrate is preferred to be 70% or greater of the entire thickness of the wiring board. That is because in the multilayer wiring board, if a component-accommodating layer for accommodating an electronic component is positioned in the center of a lamination direction, the electronic component and a surface of the wiring board are set apart by a significant distance and the inductance of the wiring between them will increase to a point that it cannot be ignored. Thus, setting the laminated layers in the first connection layer to be fewer than those in the second connection layer will reduce the distance from the electronic component to the wiring board surface on the first connection-layer side. Accordingly, the length of wiring for such a distance is also reduced and an increase in inductance is effectively mitigated.

A multilayer wiring board with a built-in electronic component according to an embodiment of the present invention has a different number of laminated layers on the upper and lower surfaces of the component-accommodating layer with an accommodated electronic component.

Obviously, numerous modifications and variations of the present invention are possible in light of the above teachings. It is therefore to be understood that within the scope of the appended claims, the invention may be practiced otherwise than as specifically described herein.

What is claimed is:

1. A wiring board with a built-in electronic component, comprising:
   a core substrate;
   an electronic component positioned in the core substrate and having a plurality of surface electrodes;
   a first upper-layer structure formed on a first surface of the core substrate and comprising an upper wiring layer and an upper insulation layer;
   a second upper-layer structure formed on a second surface of the core substrate on an opposite side with respect to the first surface of core substrate and comprising an upper wiring layer and an upper insulation layer;
   a plurality of stacked via conductors formed in the core substrate and the first upper-layer structure such that the plurality of stacked via conductors is connected to one of the surface electrodes of the electronic component; and
   a through-stacked via structure comprising a plurality of via conductors such that the via conductors are formed in and stacked through the core substrate, the first upper-layer structure and the second upper-layer structure,
   wherein the core substrate has a component-accommodating layer, a first connection layer positioned on a first surface of the component-accommodating layer, and a second connection layer positioned on a second surface on an opposite side with respect to the first surface of the component-accommodating layer, the component-accommodating layer includes a plurality of inner wiring layers and a plurality of inner insulation layers and has a cavity accommodating the electronic component, the first connection layer includes an inner wiring layer and an inner insulation layer, the second connection layer includes a plurality of inner wiring layers and a plurality of inner insulation layers such that the second connection layer includes a greater number of inner wiring layers and a greater number of inner insulation layers than the first connection layer, and the plurality of stacked via conductors is formed through the first connection layer of the core substrate and the first upper-layer structure.

2. A wiring board with a built-in electronic component according to claim 1, wherein the first upper-layer structure has an IC mounting portion formed on a surface of the first upper-layer structure.

3. A wiring board with a built-in electronic component according to claim 1, further comprising:
   a plurality of second stacked via conductors formed through the second connection layer of the core substrate and the second upper-layer structure such that the plurality of second stacked via conductors is connected to the one of the surface electrodes of the electronic component on the second surface of the component-accommodating layer.

4. A wiring board with a built-in electronic component according to claim 2, further comprising:
   a plurality of second stacked via conductors formed through the second connection layer of the core substrate and the second upper-layer structure such that the plurality of second stacked via conductors is connected to the one of the surface electrodes of the electronic component on the second surface of the component-accommodating layer.

5. A wiring board with a built-in electronic component according to claim 1 further comprising:
   a via conductor formed in the component-accommodating layer such that the via conductor is connected to the one of the surface electrodes of the electronic component on the second surface of the component-accommodating layer; and a plurality of second stacked via conductors formed through the second connection layer of the core substrate and the second upper-layer structure,
wherein the first connection layer includes a plurality of inner wiring layers and a plurality of inner insulation layers, the plurality of stacked via conductors has a stacked structure formed through the inner insulation layers of the first connection layer such that the plurality of stacked via conductors and the one of the surface electrodes of the electronic component form a first surface electrode via structure, and the plurality of second stacked via conductors has a stacked structure such that the stacked via structure of the second stacked via conductors is shifted from the via conductor in the component-accommodating layer and forms a second surface electrode via structure with the via conductor in the component-accommodating layer.

6. A wiring board with a built-in electronic component according to claim 2, further comprising:
a via conductor formed in the component-accommodating layer such that the via conductor is connected to the one of the surface electrodes of the electronic component on the second surface of the component-accommodating layer; and
a plurality of second stacked via conductors formed through the second connection layer of the core substrate and the second upper-layer structure,
wherein the first connection layer includes a plurality of inner wiring layers and a plurality of inner insulation layers, the plurality of stacked via conductors has a stacked structure formed through the inner insulation layers of the first connection layer such that the plurality of stacked via conductors and the one of the surface electrodes of the electronic component form a first surface electrode via structure, and the plurality of second stacked via conductors has a stacked structure such that the stacked via structure of the second stacked via conductors is shifted from the via conductor in the component-accommodating layer and forms a second surface electrode via structure with the via conductor in the component-accommodating layer.

7. A wiring board with a built-in electronic component according to claim 1, wherein each of the stacked via conductors is a filled via conductor comprising plating filled in a via hole.

8. A wiring board with a built-in electronic component according to claim 2, wherein each of the stacked via conductors is a filled via conductor comprising plating filled in a via hole.

9. A wiring board with a built-in electronic component according to claim 3, wherein each of the stacked via conductors is a filled via conductor comprising plating filled in a via hole, and each of the second stacked via conductors is a filled via conductor comprising plating filled in a via hole.

10. A wiring board with a built-in electronic component according to claim 4, wherein each of the stacked via conductors is a filled via conductor comprising plating filled in a via hole, and each of the second stacked via conductors is a filled via conductor comprising plating filled in a via hole.

11. A wiring board with a built-in electronic component according to claim 5, wherein each of the stacked via conductors is a filled via conductor comprising plating filled in a via hole, each of the second stacked via conductors is a filled via conductor comprising plating filled in a via hole, and the via conductor in the component-accommodating layer is a filled via conductor comprising plating filled in a via hole.

12. A wiring board with a built-in electronic component according to claim 6, wherein each of the stacked via conductors is a filled via conductor comprising plating filled in a via hole, each of the second stacked via conductors is a filled via conductor comprising plating filled in a via hole, and the via conductor in the component-accommodating layer is a filled via conductor comprising plating filled in a via hole.

13. A wiring board with a built-in electronic component according to claim 1, wherein the inner insulation layers in the core substrate comprise at least nine inner insulation layers, and the core substrate forms a thickness which is at least 70% of a total thickness of the wiring board.

14. A wiring board with a built-in electronic component according to claim 2, wherein the inner insulation layers in the core substrate comprise at least nine inner insulation layers, and the core substrate forms a thickness which is at least 70% of a total thickness of the wiring board.

15. A wiring board with a built-in electronic component according to claim 3, wherein the inner insulation layers in the core substrate comprise at least nine inner insulation layers, and the core substrate forms a thickness which is at least 70% of a total thickness of the wiring board.

16. A wiring board with a built-in electronic component according to claim 5, wherein the inner insulation layers in the core substrate comprise at least nine inner insulation layers, and the core substrate forms a thickness which is at least 70% of a total thickness of the wiring board.

17. A wiring board with a built-in electronic component according to claim 7, wherein the inner insulation layers in the core substrate comprise at least nine inner insulation layers, and the core substrate forms a thickness which is at least 70% of a total thickness of the wiring board.

18. A wiring board with a built-in electronic component according to claim 1, wherein the plurality of stacked via conductors has a stacked structure, and each of the stacked via conductors is a filled via conductor comprising plating filled in a via hole.

19. A wiring board with a built-in electronic component according to claim 7, further comprising:
a plurality of second stacked via conductors formed through the second connection layer of the core substrate and the second upper-layer structure such that the plurality of second stacked via conductors is connected to one of the surface electrodes of the electronic component on the second surface of the component-accommodating layer.

20. A wiring board with a built-in electronic component according to claim 19, wherein each of the stacked via conductors is a filled via conductor comprising plating filled in a via hole, and each of the second stacked via conductors is a filled via conductor comprising plating filled in a via hole.

* * * * *